(12) United States Patent
Bogner et al.

(10) Patent No.: US 7,199,470 B2
(45) Date of Patent: Apr. 3, 2007

(54) SURFACE-MOUNTABLE SEMICONDUCTOR COMPONENT AND METHOD FOR PRODUCING IT

(75) Inventors: Georg Bogner, Lappersdorf (DE); Jörg Erich Sorg, Regensburg (DE); Günter Waitl, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 11/052,712

(22) Filed: Jan. 31, 2005

(65) Prior Publication Data

US 2005/0212098 A1 Sep. 29, 2005

Related U.S. Application Data

(63) Continuation of application No. PCT/DE03/02259, filed on Jul. 7, 2003.

(30) Foreign Application Priority Data

Jul. 31, 2002 (DE) ................. 102 34 978
Sep. 26, 2002 (DE) ................. 102 44 888

(51) Int. Cl.
*H01L 23/12* (2006.01)
*H01L 23/48* (2006.01)
*H01L 29/40* (2006.01)
*H01L 23/52* (2006.01)

(52) U.S. Cl. .............. 257/734; 257/731; 257/773; 257/775; 257/E33.058; 257/E23.104; 257/99; 257/100

(58) Field of Classification Search ............ None
See application file for complete search history.

(56) References Cited

U.S. PATENT DOCUMENTS

| 4,843,280 A | 6/1989 | Lumbard et al. |
| 5,162,896 A | 11/1992 | Sudo |
| 5,371,404 A * | 12/1994 | Juskey et al. ............ 257/659 |
| 5,814,837 A * | 9/1998 | Okazaki ................. 257/91 |
| 5,859,475 A | 1/1999 | Darveaux |
| 5,994,773 A | 11/1999 | Hirakawa |
| 6,174,175 B1 | 1/2001 | Behfar et al. |
| 6,365,979 B1 * | 4/2002 | Miyajima ............... 257/787 |

(Continued)

FOREIGN PATENT DOCUMENTS

DE  199 63 806 C2  7/2001

(Continued)

OTHER PUBLICATIONS

"Surface Mount LED Lamp, Super Bright 0402", p. 1-6, Fairchild Semiconductor Corp., Aug. 3, 2001.

*Primary Examiner*—Jasmine Clark
(74) *Attorney, Agent, or Firm*—Cohen, Pontani, Lieberman & Pavane (57) ABSTRACT

Surface-mountable semiconductor component having a semiconductor chip (1), at least two external electrical connections (31/314/41, 32/324/42), which are electrically conductively connected to at least two electrical contacts of the semiconductor chip (1), and an encapsulation material (50). The two external electrical connections are arranged at a film (2) having a thickness of less than or equal to 100 μm. The semiconductor chip (1) is fixed at a first main surface (22) of the film (2) and the encapsulation material (50) is applied on the first surface (22).

29 Claims, 4 Drawing Sheets

U.S. PATENT DOCUMENTS

| | | |
|---|---|---|
| 7,015,593 B2 * | 3/2006 | Kazama .................... 257/790 |
| 2001/0013647 A1 | 8/2001 | Hsu |
| 2002/0195935 A1 | 12/2002 | Jager et al. |
| 2004/0047151 A1 | 3/2004 | Bogner et al. |

FOREIGN PATENT DOCUMENTS

| | | |
|---|---|---|
| DE | 100 08 203 A1 | 8/2001 |
| DE | 100 41 328 A1 | 3/2002 |
| EP | 1 056 126 | 11/2000 |
| JP | 2000-049382 A | 2/2000 |
| JP | 2002-1274463 | 10/2001 |
| JP | 2002-064164 A | 2/2002 |
| JP | 2002-110858 A | 4/2002 |
| WO | WO 97/50132 | 12/1997 |
| WO | WO 99/18609 | 4/1999 |

* cited by examiner

SURFACE-MOUNTABLE SEMICONDUCTOR COMPONENT AND METHOD FOR PRODUCING IT

RELATED APPLICATIONS

This is a continuation of International Application No. PCT/DE2003/002259, filed on Jul. 7, 2003, which claims priority from German Patent Application Nos. 102 34 978.9, filed on Jul. 31, 2002 and 102 44 888.4 filed Sep. 26, 2002 the content of all of which is hereby incorporated by reference.

FIELD OF THE INVENTION

The invention relates to a surface-mountable semiconductor component having a semiconductor chip, at least two external electrical connections, which are electrically conductively connected to at least two electrical contacts of the semiconductor chip, and an encapsulation material. It furthermore relates to a method for producing such a semiconductor component.

BACKGROUND OF THE INVENTION

In order to expand the areas of use and in order to reduce the production costs, attempts are made to produce semiconductor components in ever smaller structural sizes. By way of example, the backlighting of the keys of mobile telephones requires very small luminescence diodes.

Luminescence diode housings with an installation area dimensioned as 0402 (corresponding to 0.5 mm×1.0 mm) and a device height of 400 µm–600 µm have become available in the meantime. See the data sheet from FAIR-CHILD SEMICONDUCTOR® concerning the QTLP690C-x design. The corresponding device concept is described in the document U.S. Pat. No. 4,843,280.

A further reduction of the device height is extremely difficult with the conventionally available housing concepts.

SUMMARY OF THE INVENTION

One object of the present invention is to provide a surface-mountable semiconductor component, in particular a surface-mountable miniature luminescence diode and/or photo diode, which permits the structural size to be reduced more extensively.

This and other objects are attained in accordance with one aspect of the present invention directed to a surface-mountable semiconductor component comprising a semiconductor chip, at least two external electrical connections, which are electrically conductively connected to at least two electrical contacts of the semiconductor chip, and a chip encapsulation material. The two external electrical connections are formed at a film having a thickness of less than or equal to 100 µm. The semiconductor chip is fixed at a first surface of the film, and the encapsulation material is applied on the first surface.

Designs with a very small structural height can be obtained by mounting the semiconductor chip on a very thin film on which the external electrical connections are formed, which designs can, moreover, be produced with high packing density and thus with low production costs.

The design according to an embodiment of the invention is, for example, suitable for application in electromagnetic radiation emitting and/or receiving components having one or more electromagnetic radiation emitting and/or receiving semiconductor chips, in particular for luminescence diode components having a housing installation area dimensioned as 0402 (corresponding to 0.5 mm×1.0 mm) or less and a device height of less than 400 µm in particular less than 350 µm.

In the case of luminescence diode components, the encapsulation material is produced from an electromagnetic radiation-transmissive, in particular transparent or translucent material, in particular from an electromagnetic radiation-transmissive, preferably unfilled clear plastic material.

In order to provide a luminescence diode component according to the invention, which emits mixed-colored light, the encapsulation material may be admixed with a phosphor that absorbs at least a portion of the electromagnetic radiation emitted by the luminescence diode chip and emits electromagnetic radiation having a different wavelength and color than the absorbed radiation.

The encapsulation material is preferably produced by means of an injection-molding method.

The film including the external electrical connections, on the side on which the semiconductor chips are arranged, can be coated with a covering layer that is adhesion-promoting with respect to the encapsulation material and has mounting windows at the chip mounting locations and at the wire mounting locations, no covering layer being present in said mounting windows. What is advantageously achieved thereby is that an impermissibly large misalignment of the chip mounting installation and/or wire mounting installation can be rapidly identified because the semiconductor chips and/or connection wires do not adhere on the film after their mounting. This is all the more important, the smaller the design, because firstly the reliability of the components is impaired by a misalignment of the chip mounting all the more, the smaller the volume of the encapsulation material, and secondly the quantity of rejects is very high in the event of misalignment that is not immediately identified, on account of the high packing density of the components and the associated large quantity of components per unit length on a mounting tape.

In an embodiment of the semiconductor component, two external electrical connections are in each case formed by a first electrical connection region on the first main area of the film, a second electrical connection region on the second main area of the film and at least one electrical leadthrough through the film, which electrically connects the first connection region to the associated second connection region. This advantageously enables a technically simple production of the external electrical connections, which do not lead to an enlargement of the installation area of the component.

The electrical connection regions can be produced by means of patterned metal layers on the film. Conventional suitable methods can be used for patterning the metal layers.

In a refinement, the metal layers are constructed in multilayered fashion and preferably have, as seen from the film, a first layer made of copper or a copper based alloy, which is responsible for the electrical conduction of the metal layer, a second layer made of nickel or a nickel based alloy, which constitutes a barrier layer, and a third layer made of gold or a gold based alloy, which serves for improving the bondability and solderability of the metal layer.

In an alternative refinement, the metal layers situated on the chip side preferably have, as seen from the plastic film, a copper layer followed by a nickel layer, on which, in turn, an NiP layer (phosphorus content for example between 5% and 15%, preferably 8%) is applied. The NiP layer advantageously has a higher reflectivity than an Ni layer and its bondability is at least similarly as good as that of an Ni layer.

Moreover, it advantageously has a significantly lower tendency to tarnishing (oxidizing) than an Ni layer. The metal layers situated on the rear side of the leadframe then have the same layer sequence, as seen from the plastic layer, in order in particular to simplify the production of the leadframe. In order to increase the storage stability, a gold layer may preferably be applied to the NiP layer.

The first layer has a thickness of between 5 µm and 25 µm inclusive.

In order to ensure a sufficient heat dissipation from the semiconductor chip, the latter is fixed on one of the two first electrical connection regions by means of a connecting means having good thermal conductivity and the corresponding external electrical connection is formed in such a way that it constitutes a sufficiently good thermal connection for the semiconductor chip. This means that, in particular, its material composition, its layer thickness and the electrical leadthrough through the film are designed for good thermal conductivity.

The semiconductor chip may be mounted onto the associated electrical connection region both by its substrate side (i.e. upside up mounting) and by its epitaxial layer side (upside down or flip-chip mounting). The connecting means is, by way of example, a sufficiently thermally conductive adhesive or a metallic solder.

The encapsulation material preferably has, in an edge region toward its lateral edge as seen in the perpendicular direction with respect to the film, a smaller thickness than in a central region that spans at least the semiconductor chip and, if appropriate, one or more bonding wires to the light-emitting diode chip. This advantageously reduces the volume of the encapsulation material, as a result of which it is possible to counteract a warpage of the film during the production method on account of different thermal expansions of film and encapsulation material.

In an embodiment of the semiconductor component which, on the one hand, ensures a secure bondability of the semiconductor chip and of bonding wires on the respectively assigned external electrical connections and, on the other hand, brings about no or virtually no enlargement of the installation area of the housing, the mutually opposite ends of the external electrical connections have regions that project in each case in an offset manner with respect to one another, the electrical leadthroughs through the film being arranged in said regions. The mutually opposite ends of the external electrical connections can run in an S-like manner such that the projecting parts overlap.

Another aspect of the present invention directed to a method for simultaneously producing a multiplicity of surface-mountable semiconductor components each having at least one semiconductor chip, at least two external electrical connections, which are electrically conductively connected to at least two electrical contacts of the semiconductor chip, and an encapsulation material. A film strip is provided which has on both sides electrically conductive layers that are patterned and through-connected through the film strip in such a way that an array comprising a multiplicity of component region arranged next to one another is formed. Each of the component regions includes structures of the electrically conductive layers for the at least two external electrical connections. At least one semiconductor chip is applied on each of the component regions and the semiconductor chip is electrically connected to the associated external electrical connections. The array is introduced into an injection mold, in which a single cavity which spans all the semiconductor chips of the array and forms a void there essentially exclusively on the side of the semiconductor chips is provided for an array. Encapsulation material is injected into the cavity and at least partially cured before removing the array from the injection mold. The array is singulated into individual semiconductor components by means of severing the encapsulation material and the film strip with the patterned electrically conductive layers between the component regions.

In order to counteract an excessively great warpage of the array on account of different thermal expansions of encapsulation material and film, the cavity has a multiplicity of cutouts in each case spanning one or more semiconductor chips. In this way, the volume of encapsulation material is reduced in that the thickness of the encapsulation material is reduced in regions where this is permissible compared with the thickness in the region of semiconductor chips and, if appropriate, one or more bonding wires to the semiconductor chip.

A separate cutout can be provided above each semiconductor chip of the array in such a way that the encapsulation material has, after the injection-molding process, a multiplicity of elevations arranged next to one another, in particular a structure similar to a chocolate bar.

The array is singulated by means of severing the encapsulation material and the film strip with the patterned electrically conductive layers in the trenches between the elevations.

In an expedient manner, before the array is introduced into the injection mold, an adhesion promoter is applied to the film and/or the electrically conductive layers, which adhesion promoter improves the adhesion of the encapsulation material on the film and/or the electrically conductive layers. A PI covering coating is preferably used for this purpose.

The adhesion promoter is preferably in each case applied to the entire component region, except for the chip mounting regions, on which the semiconductor chips are fixed, and, if appropriate, the wire mounting regions, on which connection wires are fixed. The adhesion promoter has contact-making windows in these regions. Such an adhesion promoter layer entails, in particular, the advantages with regard to identification of a misalignment of the production installation as explained further above in connection with the description of the semiconductor component.

With regard to technically simple handling of the semiconductor components after singulation, the film strip with the patterned electrically conductive layers is laminated onto an auxiliary film by its rear side prior to introduction into the injection mold. Said auxiliary film protects the electrical connections on the one hand against mechanical damage (e.g. scratching) and on the other hand against undesirable covering of the connections with encapsulation material, that is to say against a so-called flash on the rear side of the film strip.

The auxiliary film expediently has a coefficient of thermal expansion which is similar to or greater than that of the encapsulation material in such a way that it counteracts to the greatest possible extent a warpage of the array on account of shrinkage of the encapsulation material to a greater extent than the film strip during the curing and/or cooling of said encapsulation material after the array has been encapsulated by injection molding.

For basically the same purpose, the film strip may have, outside the arrays, holes, perforations and/or slots for reducing mechanical strains on account of different thermal expansions and/or material shrinkages.

As an alternative to the above-described means for reducing the warpage of the array, the film strip may be composed of a material that has a coefficient of thermal expansion similar to that of the encapsulation material.

As a further alternative or additional measure, it is possible to use a bowed injection mold in which the array is curved in a convex fashion, as seen from the side on which the material having the larger coefficient of thermal expansion is later situated, during the injection of the encapsulation composition into the cavity.

In order to enable an electrical and/or optical testing of the semiconductor components, the array is applied to a film by the encapsulation side prior to singulation and afterward, if appropriate, the auxiliary film is stripped from the rear side of the film. For the case where an optical measurement of the semiconductor component is required, said film is preferably transmissive to electromagnetic radiation and the measurement is effected through the film.

The array is preferably singulated by means of sawing, laser separation and/or water jet cutting.

Through the use of the patterned electrically conductive flexible film, all process steps of the method according to the invention can be carried out reel-to-reel (from a take-off to a take-up reel), which minimizes the handling effort during production.

Moreover, an embodiment of the invention affords the possibility of dispensing with taping of the devices. If desired, a plurality of associated devices may be supplied after a chip test on the flexible frame together with a wafer map. As an alternative, the devices may be singulated, taped and supplied as before after the chip test.

DETAILED DESCRIPTION OF THE DRAWINGS

In the figures, identical or identically acting constituent parts are in each case provided with the same reference symbols. Only those constituent parts which are essential for understanding the invention are described in each case.

Figure 1:
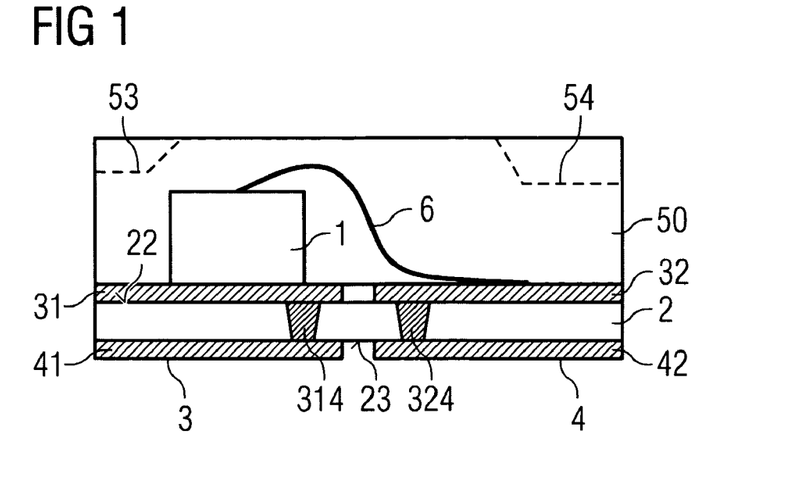
FIG. 1 shows a schematic sectional view through the semiconductor component in accordance with the exemplary embodiment.

The semiconductor component according to the invention as illustrated in FIG. 1 is a surface-mountable miniature light-emitting diode component having a footprint of the 0402 type. In the case of the latter, two external electrical connections 3, 4 are formed on a plastic film 2, which is made for example of polyimide (PI) or polyethylene naphthalate (PEN). The thickness of the plastic film 2 is approximately 50 µm or less. A light-emitting diode chip 1 is fixed at an upper surface 22 of the plastic film 2 and is encapsulated there with an encapsulation material 50 applied on the upper surface 22.

The encapsulation material 50 is preferably composed of a clear plastic material, preferably an unfilled clear epoxy resin material, which can be processed by means of injection molding or transfer molding.

The two external electrical connections 3, 4 in each case comprise a first metalized region 31, 32 on the upper surface 22 of the film 2, a second metalized region 41, 42 on a lower surface 23 of the film 2 and at least one metallic electrical leadthrough 314, 324 through the film 2, which respectively electrically connect the first metalized region 31, 32 to the associated second metalized region 41, 42.

The metalized regions 31, 32, 41 and 42 in each case have a plurality of layers and contain, as seen from the film 2, successively an electrical conduction layer having copper or a copper based alloy and a barrier layer having nickel or a nickel based alloy. A connection layer having gold or a gold based alloy is in each case situated on the barrier layer for the purpose of improving the bondability or solderability. Copper based alloy, nickel based alloy and gold based alloy are to be understood to mean all alloys whose properties are substantially determined by copper, nickel and gold, respectively.

As an alternative, the metalized regions 31 and 32 situated on the upper surface 22 preferably have, as seen from the plastic film 2, a copper layer followed by a nickel layer, on which, in turn, an NiP layer (phosphorus content for example between 5% and 15%, preferably 8%) is applied. The NiP layer advantageously has a higher reflectivity than an Ni layer and its bondability is at least similarly as good as that of an Ni layer. Moreover, it advantageously has a significantly lower tendency to tarnishing (oxidizing) than an Ni layer. In order, in particular, to configure the production process with the least possible number of process steps, the metalized regions 41 and 42 situated on the lower surface 23 preferably have the same layer sequence of metalized regions 31 and 32 as seen from the plastic layer 2. In order to increase the storage stability, a gold layer may preferably be applied to the NiP layer.

The thickness of the electrical conduction layer lies between 5 and 25 µm inclusive.

The light-emitting diode chip 1 is fixed on the electrical connection region 31 by means of a connecting means having good thermal conductivity and the associated external electrical connection 31, 314, 41 is formed in such a way that it can be utilized as a thermal connection for the light-emitting diode chip. The light-emitting diode chip can be mounted onto the electrical connection region 31 both by its substrate side (i.e. upside up mounting) and by its epitaxial layer side (upside down or flip-chip mounting). The connecting means is, by way of example, a sufficiently thermally conductive adhesive or a metallic solder.

The encapsulation material 50 preferably has, in an edge region 52 (see FIG. 5) toward its lateral edge as seen in the perpendicular direction with respect to the film, a smaller thickness than in a central region 51 (see FIG. 5) that spans at least the semiconductor chip 1 and, if appropriate, one or more bonding wires 6 to the light-emitting diode chip 1. This is indicated by the dashed lines 53, 54 in FIG. 1 and can be seen from FIGS. 5, 6 and 7.

The lateral dimensions of the surface-mountable light-emitting diode component are at most 0.5 mm×1 mm and the device height is less than or equal to 0.4 mm, preferably less than or equal to 0.35 mm.

In order to realize a light-emitting diode component which emits mixed-colored light or in order to convert a UV component of the radiation emitted by the light-emitting diode chip into visible light, the encapsulation material may be admixed with a phosphor that absorbs at least a portion of the electromagnetic radiation emitted by the luminescence diode chip and emits electromagnetic radiation having a greater wavelength than the absorbed radiation.

Figure 7:
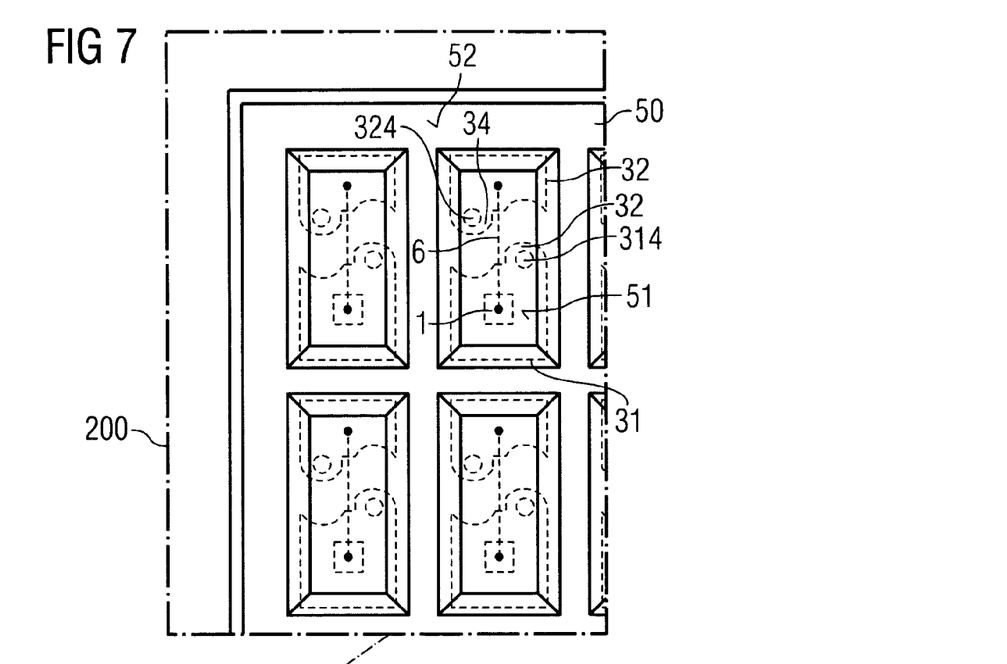
FIG. 7 shows an enlarged schematic illustration of a detail from the film strip illustrated in FIG. 6.

As can be seen from FIG. 7, inter alia, the mutually opposite ends of the external electrical connection regions 31 and 32 in each case have an S-like course, in the case of which a projecting part of one end respectively projects into a recessed part of the other end. The electrical leadthroughs 314, 324 are in each case arranged in a projecting part of the ends running in an S-like manner.

Figure 2:
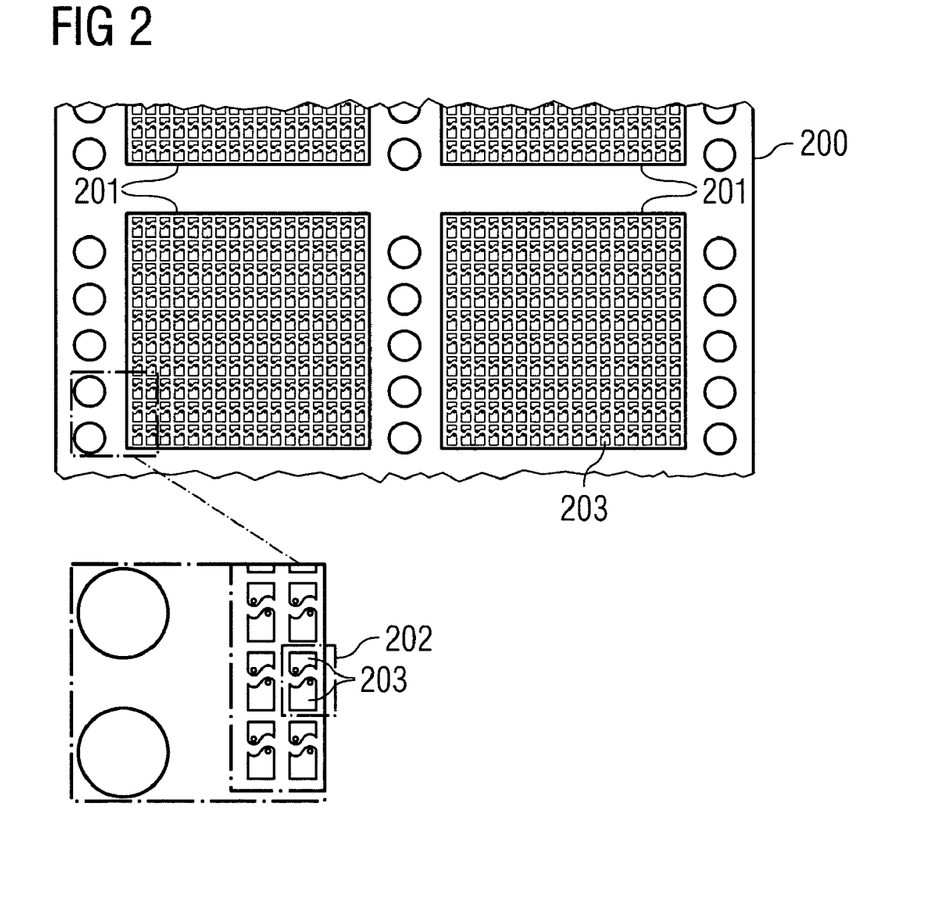
FIG. 2 shows a schematic illustration of a plan view of the front side of a detail from a film strip.
Figure 3:
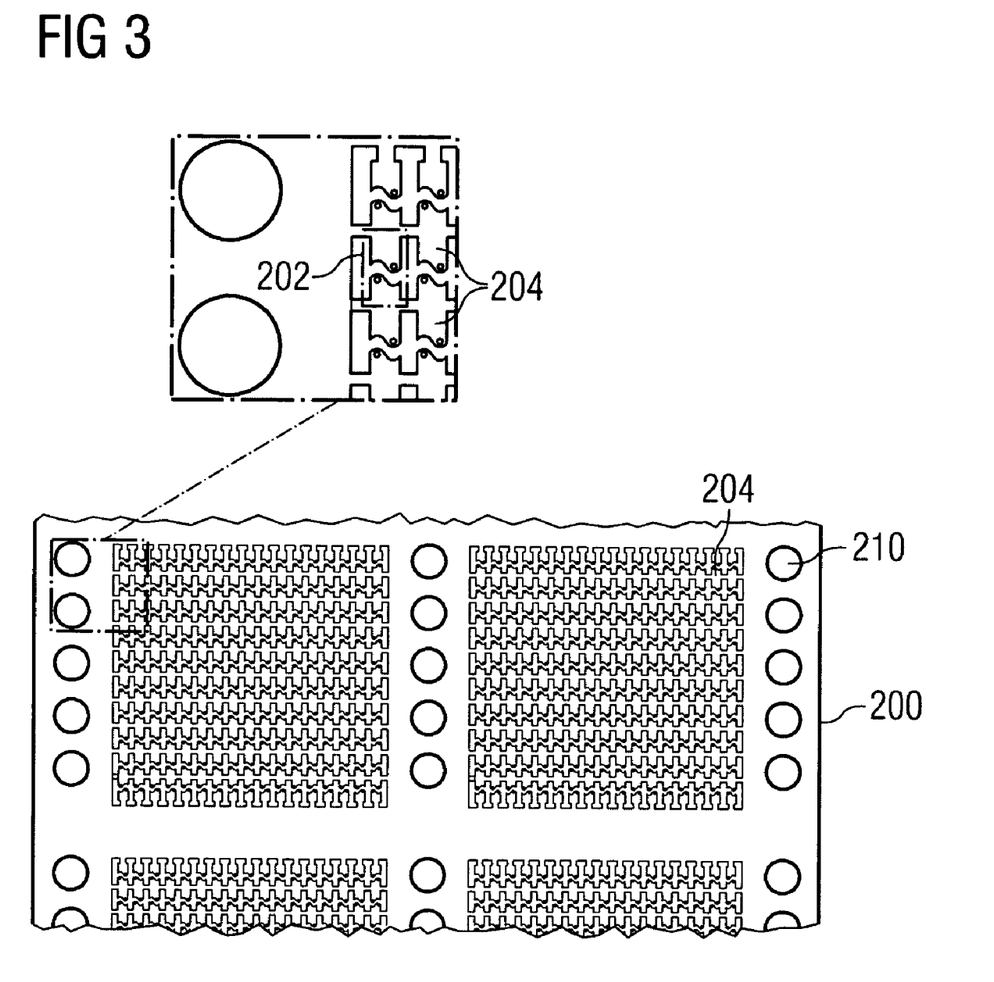
FIG. 3 shows a schematic illustration of a plan view of the rear side of the detail from FIG. 2.

In the case of the method for simultaneously producing a multiplicity of surface-mountable semiconductor components in accordance with the exemplary embodiment, firstly a film strip 200 is produced, which is provided, on both sides, with electrically conductive layers 203, 204 that are patterned and through-connected by means of metallic leadthroughs through the film strip in such a way that an array 201 comprising a multiplicity of component regions 202 arranged next to one another is formed. The front side of the film strip 200 with the front-side metalization structure 203 is illustrated in FIG. 2 and the rear side of the film strip 200 with the rear-side metalization structure 204 is illustrated in FIG. 3. A component region is indicated by the dash-dotted lines 202 in the enlarged details of FIGS. 2 and 3. Each of the component regions 202 has, on the front and rear side of the film strip 200, in each case a metalization structure 203, 204 which, together with electrical leadthroughs 314, 324 (cf. FIG. 7), form a first 3 and a second external electrical contact 4.

In each component region 202, two external electrical connections 31/314/41 and 32/324/42 (cf. FIG. 1) are formed on the upper and lower surfaces 22, 23 of the film strip 2, each of the connection areas 31, 32 on the upper surface 22 being electrically connected to one of the connection areas 41, 42 on the lower surface 23 by means of at least one electrical leadthrough 314, 324 through the film strip 2.

A light-emitting diode chip 1 is applied to each of the component regions, to be precise directly to the patterned metalized region 31. The connection between the light-emitting diode chip 1 and the metallic layer 31 is effected by means of an electrically and thermally conductive adhesive which contact-connects a rear-side contact of the light-emitting diode chip 1 both electrically and thermally to the metallic layer 31 of the external electrical connection 3. Afterward, a front-side contact of each light-emitting diode chip 1 is connected to the metallic layer 32 of the associated external electrical connection 4 by means of a respective bonding wire 6.

Figure 4:
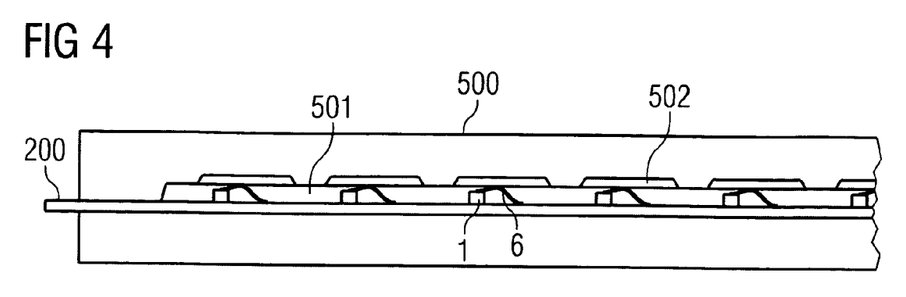
FIG. 4 shows a partial schematic illustration of a sectional view of an injection mold with an introduced film strip.

In a step subsequent to this chip mounting and connection procedure, the array 201—provided with the light-emitting diode chips 1—is introduced into an injection mold 500 (cf. FIG. 4). At least one cavity 501 is formed in said injection mold 500, which cavity spans all the semiconductor chips 1 of the array 201 and leaves a void for the encapsulation composition only on the side of the light-emitting diode chips 1 above the film strip. The encapsulation material is subsequently injected into said cavity, preferably by means of a film gate from a side of the cavity.

The cavity 501 has a multiplicity of cutouts 502 that are in each case positioned above a semiconductor chip 1 during injection-molding. Consequently, the thickness of the encapsulation material 50 is in each case made larger in the regions of the light-emitting diode chips 1 and the bonding wires 6 than in the remaining region of the array 201. After removal of the array 201 from the injection mold, the encapsulation material has a multiplicity of elevations 51 arranged next to one another, so that the array overall has, after encapsulation, a structure similar to a chocolate bar structure (cf. FIGS. 6 and 7).

The advantage of such a configuration is specified in the general part of the description. It reduces the warpage of the array during the curing of the encapsulation material.

Figure 5:
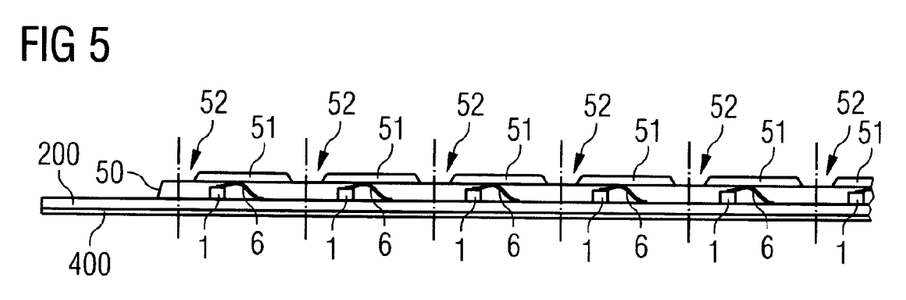
FIG. 5 shows a partial schematic illustration of a sectional view of a film strip with encapsulated semiconductor chips.
Figure 6:
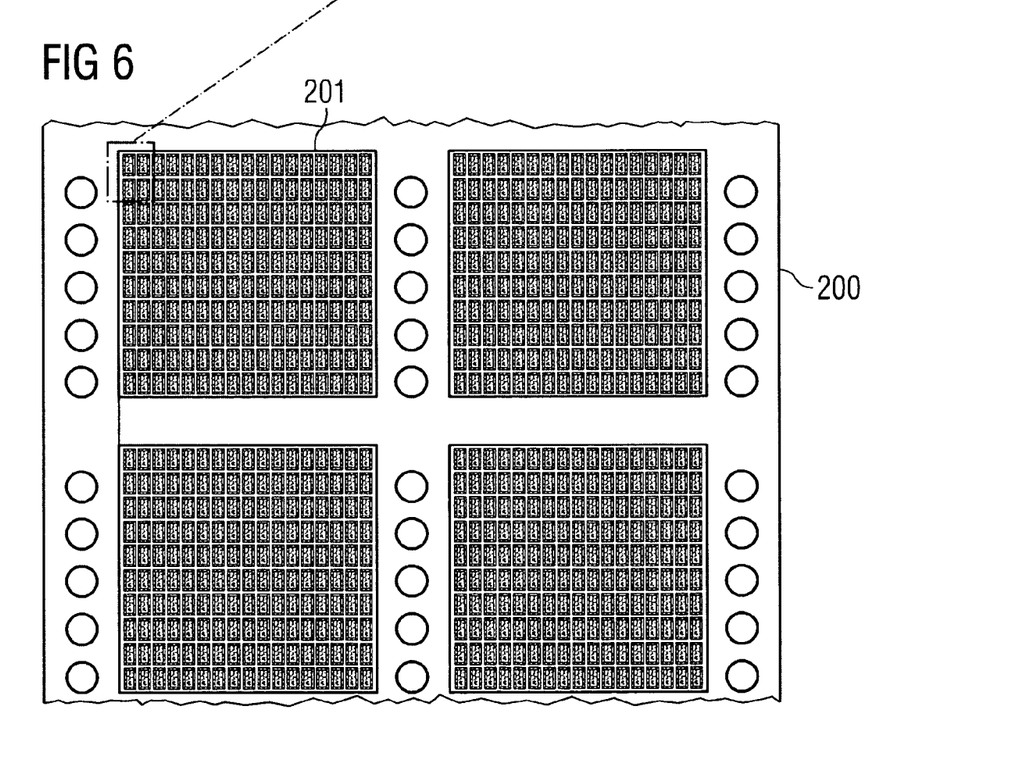
FIG. 6 shows a partial schematic illustration of a plan view of a film strip with encapsulated semiconductor chips.

After the encapsulation material 50 has at least partially cured, the light-emitting diode array 201 encapsulated by injection molding is removed from the injection mold 500 and preferably applied to an adhesive film 400 by the rear side of the film strip 200 (cf. FIG. 5). This application to an adhesive film 400 serves to hold the array 201 together in the assemblage during and after later singulation into individual light-emitting diode components.

The array 201 is singulated by means of severing the encapsulation material material and the film strip 200 with the patterned metalizations 203, 204 between the component regions 202, that is to say in the trenches 52 between the elevations 51 of the encapsulation material 50. Conventional methods such as sawing, laser separation or water jet cutting may be used for this purpose.

In order to improve the adhesion between the encapsulation material 50 and the film strip 200, an adhesion promoter, in particular in the form of a covering coating made of polyimide, is applied to the film strip 200 and/or the electrically conductive layers 203, 204. Preferably, the adhesion promoter is in each case applied to the entire region of the array 201, excluding the chip mounting regions, in which the light-emitting diode chips 1 are mounted onto the assigned external electrical connections 3 and contact-connected, and excluding the wire mounting regions, on which the bonding wires 6 are connected to the associated external electrical connections 4.

In a refinement of the method, the film strip 200 with the patterned metalization layers 203, 204 is laminated onto an auxiliary film prior to introduction into the injection mold 500, which auxiliary film has a coefficient of thermal expansion that is similar to or greater than that of the encapsulation material. The auxiliary film can thus counteract a warpage of the array on account of shrinkage of the encapsulation material 50 to a greater extent than the film strip 200 during the curing and/or cooling of said encapsulation material after the encapsulation of the array 201 by injection molding. Afterward, during singulation, the auxiliary film may perform the function of the adhesive film described above.

A further measure for counteracting the warpage of the array on account of mechanical strains owing to different thermal expansions and/or material shrinkages of encapsulation material and film strip is to form holes, perforations and/or slots 210 (see FIG. 3) outside the array 201.

As an alternative or in addition to the measures described above, it is possible to use a film strip 200 that is composed of a material having a coefficient of thermal expansion that is similar to the encapsulation material 50.

Furthermore as an alternative or in addition, it is possible for the same reason to use a bowed injection mold in which the array 201 is curved in a convex fashion as seen from the side of the light-emitting diode chips 1 during the injection of the encapsulation composition 50 into the cavity 501.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

We claim:

1. A surface-mountable semiconductor component comprising:
   a semiconductor chip adapted for at least one of emitting electromagnetic radiation and receiving electromagnetic radiation;
   at least two external electrical connections, which are electrically conductively connected to at least two electrical contacts of the semiconductor chip; and
   an encapsulation material;
   wherein said two external electrical connections are formed at a film having a thickness of less than or equal to 100 µm;
   wherein the semiconductor chip is fixed at a first surface of the film; and wherein the encapsulation material is applied on the first surface and comprises an electromagnetic radiation-transmissive material.

2. The semiconductor component as claimed in claim 1, in which the encapsulation material is produced by means of an injection-molding method.

3. The semiconductor component as claimed in claim 1, in which each of the at least two external electrical connections comprises a first electrical connection region on the first surface of the film, a second electrical connection region on a second surface of the film and at least one electrical leadthrough through the film, which electrically connects the first connection region to the associated second connection region.

4. The semiconductor component as claimed in claim 3, in which the electrical connection regions are patterned metal layers on the film.

5. The semiconductor component as claimed in claim 4, in which the metal layers are constructed in multilayered fashion and contain, as seen from the film, successively a conduction layer having copper or a copper based alloy and a barrier layer having nickel or a nickel based alloy.

6. The semiconductor component as claimed in claim 5, in which a connection layer having gold or a gold based alloy is applied on the barrier layer for the purpose of improving the bondability and solderability.

7. The semiconductor component as claimed in claim 5, in which the conduction layer has a thickness of between 5 and 25 µm inclusive.

8. The semiconductor component as claimed in claim 3, in which the semiconductor chip is fixed on one of the two first electrical connection regions with a connecting means having good thermal conductivity and the corresponding external electrical connection is formed in such a way that it can be utilized as a thermal connection for the semiconductor chip.

9. The semiconductor component as claimed in claim 1, in which the encapsulation material has, in a region around its center which encompasses at least the semiconductor chip and, if appropriate, one or more bonding wires to the semiconductor chip, as seen in the perpendicular direction with respect to the film, a greater thickness than in a second region toward its lateral edge.

10. The semiconductor component as claimed in claim 1, in which the semiconductor component has lateral dimensions of at most 0.5 mm×1 mm and a height of less than or equal to 0.4 mm.

11. The semiconductor component as claimed in claim 1, in which the semiconductor chip is a luminescence diode chip and the electromagnetic radiation-transmissive material is an electromagnetic radiation-transmissive plastic.

12. The semiconductor component as claimed in claim 11, in which the electromagnetic radiation-transmissive material contains a phosphor that absorbs at least a portion of the electromagnetic radiation emitted by the luminescence diode chip and emits electromagnetic radiation having a different wavelength than the absorbed radiation.

13. The semiconductor component as claimed in claim 11, in which the electromagnetic radiation-transmissive material is an unfilled clear plastic material.

14. The semiconductor component as claimed in claim 1, in which the film has a thickness of 50 µm or less.

15. The semiconductor component as claimed in claim 1, in which the film is a plastic film.

16. The semiconductor component as claimed in claim 15, m which the film has polyimide or polyethylene naphthalate.

17. The semiconductor component as claimed in claim 4, in which each of mutually opposite ends of the external electrical connections runs in an S-like manner and each of the electrical leadthroughs arranged in a projecting part of the ends running in an S-like manner.

18. A surface-mountable semiconductor component comprising:
   a semiconductor chip;
   at least two external electrical connections, which are electrically conductively connected to at least two electrical contacts of the semiconductor chip; and
   an encapsulation material,
   wherein said two external electrical connections are formed at a film having a thickness of less than or equal to 100 µm,
   wherein the semiconductor chip is fixed at a first surface of the film,
   wherein the encapsulation material is applied on the first surface, and
   wherein the semiconductor component has lateral dimensions of at most 0.5 mm×1 mm and a height of less than or equal to 0.4 mm.

19. The semiconductor component as claimed in claim 18, in which each of the two at least two external electrical connections comprises a first electrical connection region on the first surface of the film, a second electrical connection region on a second surface of the film and at least one electrical leadthrough through the film, which electrically connects the first connection region to the associated second connection region.

20. The semiconductor component as claimed in claim 19, in which the electrical connection regions are patterned metal layers on the film.

21. The semiconductor component as claimed in claim 20, in which the metal layers are constructed in multilayered fashion and contain, as seen from the film, successively a conduction layer having copper or a copper based alloy and a barrier layer having nickel or a nickel based alloy.

22. The semiconductor component as claimed in claim 18, in which the encapsulation material has, in a region around its center which encompasses at least the semiconductor chip and, if appropriate, one or more bonding wires to the semiconductor chip, as seen in the perpendicular direction with respect to the film, a greater thickness than in a second region toward its lateral edge.

23. The semiconductor component as claimed in claim 18, in which the film is a plastic film.

24. A surface-mountable semiconductor component comprising:
   a semiconductor chip;
   at least two external electrical connections, which are electrically conductively connected to at least two electrical contacts of the semiconductor chip; and
   an encapsulation material, wherein said two external electrical connections are formed at a film having a thickness of 50 μm or less, wherein the semiconductor chip is fixed at a first surface of the film, and wherein the encapsulation material is applied on the first surface.

25. The semiconductor component as claimed in claim 24, in which each of the two at least two external electrical connections comprises a first electrical connection region on the first surface of the film, a second electrical connection region on a second surface of the film and at least one electrical leadthrough through the film, which electrically connects the first connection region to the associated second connection region.

26. The semiconductor component as claimed in claim 25, in which the electrical connection regions are patterned metal layers on the film.

27. The semiconductor component as claimed in claim 26, in which the metal layers are constructed in multilayered fashion and contain, as seen from the film, successively a conduction layer having copper or a copper based alloy and a barrier layer having nickel or a nickel based alloy.

28. The semiconductor component as claimed in claim 24, in which the encapsulation material has, in a region around its center which encompasses at least the semiconductor chip and, if appropriate, one or more bonding wires to the semiconductor chip, as seen in the perpendicular direction with respect to the film, a greater thickness than in a second region toward its lateral edge.

29. The semiconductor component as claimed in claim 24, in which the film is a plastic film.

* * * * *

UNITED STATES PATENT AND TRADEMARK OFFICE
CERTIFICATE OF CORRECTION

PATENT NO. : 7,199,470 B2  Page 1 of 1
APPLICATION NO. : 11/052712
DATED : April 3, 2007
INVENTOR(S) : Georg Bogner It is certified that error appears in the above-identified patent and that said Letters Patent is hereby corrected as shown below:

Title page item [56] should read

FOREIGN PATENT DOCUMENTS

| DE | 199 63 806 C2 | 7/2001 |
|---|---|---|
| DE | 100 08 203 A1 | 8/2001 |
| DE | 100 41 328 A1 | 3/2002 |
| EP | 1 056 126 A | 11/2000 |
| JP | 2000-049382 A | 2/2000 |
| JP | ~~2002-1274463~~ 2001-274463 | 10/2001 |
| JP | 2002-064164A | 2/2002 |
| JP | 2002-110858 A | 4/2002 |
| W/O | WO97/50132 A | 12/1997 |
| W/O | WO 99/18609 A | 4/1999 |

Signed and Sealed this

Twenty-second Day of June, 2010

David J. Kappos
*Director of the United States Patent and Trademark Office*